(12) United States Patent
Liu et al.

(10) Patent No.: US 6,372,390 B1
(45) Date of Patent: Apr. 16, 2002

(54) PHOTO MASK WITH AN ESD PROTECTIVE FUNCTION

(75) Inventors: En-Chuan Liu, Yung-Kang; Chiao-Lin Peng, Hsin-Chu; Tai-Yuan Lee, Taipei, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 29 days.

(21) Appl. No.: 09/584,698

(22) Filed: Jun. 1, 2000

(51) Int. Cl.$^7$ .................................................. G03F 9/00

(52) U.S. Cl. ........................................................... 430/5

(58) Field of Search ..................... 430/5, 322; 438/713; 257/555, 355, 357

(56) References Cited

U.S. PATENT DOCUMENTS 5,989,754 A * 11/1999 Chen et al. ..................... 430/5
6,265,756 B1 * 7/2001 Brockett et al. ............ 257/555

* cited by examiner

Primary Examiner—S. Rosasco
(74) Attorney, Agent, or Firm—Winston Hsu

(57) ABSTRACT

The invention provides a photo mask with an electric discharge (ESD) protective function. The photo mask has a transparent substrate comprising quartz or glass, a patterned shielding layer located in the predetermined area of the surface of the transparent substrate, and an ESD protective layer positioned on the surface of the transparent substrate and surrounding the shielding layer. The ESD protective layer comprises a plurality of discharging peaks. The peaks aid in a neutralizing discharge reaction, which discharges harmful static electricity into the air.

19 Claims, 2 Drawing Sheets

PHOTO MASK WITH AN ESD PROTECTIVE FUNCTION

BACKGROUND OF THE INVENTION

1. Field of the Invention

The present invention relates to a photo mask with an electric-discharge (ESD) protective function, and more particularly, to a photo mask that discharges static electricity into the air through discharging peaks.

2. Background of the Invention

Photolithography is an important step in the process of semiconductor production, and many things associated with MOS transistors, such as film patterns and dopant regions, are determined by this step Photolithography proceeds basically by covering a layer of photosensitive material, and casting a parallel light beam through a glass mask onto the photosensitive material. Because of the pattern of the circuit layout on the photo mask, the photosensitive material undergoes a selective photo reaction so as to transfer the pattern on the photo mask onto the semiconductor wafer.

In general, the photo mask comprises a smooth and transparent plate of glass or quartz as its foundation and a layer of chromium film 1000 Å thick over the surface of the photo mask. The pattern with a transparent-opaque layout on the photo mask is etched onto the chromium film for pattern-transferring. But in the process of using or storing the photo mask, static electricity may be induced, forming an electric field on the photomask. The electric field attracts particles in the air to the photo mask or undergoes a neutralizing discharge reaction on the surface of the photo mask, resulting in burn marks. Consequently, the pattern transferred through the photo mask can lose its clarity.

Please refer to FIG. 1, which is a prior art photo mask 10. The prior art photo mask with an ESD protective function comprises a transparent quartz substrate 12, a pattern area 14 positioned on a predetermined area on the surface of the quartz substrate 12 for pattern-transferring, an inner chromium film 16 positioned on the surface of the quartz substrate and around the pattern area 12, an ESD annulus 18 comprising an exposed quartz substrate positioned on the surface of the transparent quartz substrate 12 and around the inner chromium film 16, and an outer chromium film 20 on the surface of the quartz substrate 12 and the ESD annulus 18. The ESD annulus 18 is an insulated layer for insulating the inner chromium film 16 and the outer chromium fill 20.

When the photo mask 10 touches a user, electrostatic charges are induced on the outer chromium film 20. The electrostatic charges on the outer chromium film 20 induce the opposite inductive charges on the inner chromium film 16 Since the inner chromium film 16 and the pattern area 14 are electrically neutral, the pattern area 14 also carries the equal amount of the opposite charge upon the induction of the inductive charges on the inner chromium film 16.

Consequently, an electric field is formed in the pattern area 14 that draws particles in the air onto the pattern area 14 or has a neutralizing discharge reaction with the air particles, leaving burn marks in the pattern area 14. Also, the neutralizing discharge reaction results in high heat in the thin end of the circuit pattern, damaging the pattern. Once inductive charges in the outer chromium film 20 accumulate to a certain level, they have a neutralizing discharge reaction with the opposite charges of the inner chromium film 16 as well, canceling out the accumulated charges and restoring the inner and outer chromium films 16 and 20 to neutral. But in the neutralizing discharge reaction, the charges unload their electrical energy to reach a more stable state. The electrical energy turns into heat, making burn marks in the thin circuit end of the pattern area 14, damaging the pattern.

Present semiconductor manufacturing processing can be as small as 0.15 μm, and the damage to the circuit pattern caused by the neutralizing discharge reaction will only get worse as process sizes shrink. Every time damage to the circuit pattern occurs, the photo mask, and sometimes even the entire semiconductor wafer, has to be discarded. Consequently, such damage affects the quality of pattern transfer, severely lowers productivity, and shortens the life of the photo mask.

SUMMARY OF THE INVENTION

The object of the claimed invention is to solve the problem described above by providing a photo mask with an electric discharge protective function, wherein static electricity is discharged into the air through discharging peaks by means of a neutralization discharge reaction so as to prevent the thin circuit end of the circuit pattern on the photo mask from being damaged by the neutralizing discharge reaction.

The claimed invention provides a photo mask with an ESD protective function that comprises a transparent substrate comprised of quartz or glass with a thickness of 1000~1200 angstroms, a patterned chromium shielding layer on the transparent substrate, and an ESD protective thin layer of chromium film 1000~1200 angstroms thick positioned on the surface of the transparent substrate and around the shielding chromium layer. The ESD protective layer has a plurality of discharging peaks with the function of discharging the static electricity in the ESD protective layer into the air, resulting in a neutralizing discharge reaction.

Moreover the presented area in the photomask of the claimed invention has a chromium film of 1000~1200 Å thick, whose outer fringe comprises peaks arrayed in a saw-toothed structure, pointing outward, which can discharge the static electricity in the ESD protective layer into the air so as to remove charges from the photo mask.

Because of the outward-pointing peaks in the outer area of the photo mask, the static electricity induced in the photo mask concentrates and forms electrical fields on the peaks instead of lingering in the patterned area. When the static electricity accumulates to a certain level in the peaks, it is discharged into the air and neutralized. Furthermore, the high heat that results from the neutralizing discharge reaction will only affect the protected area and will not damage the circuit pattern in the pattern area.

These and other objectives of the claimed invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
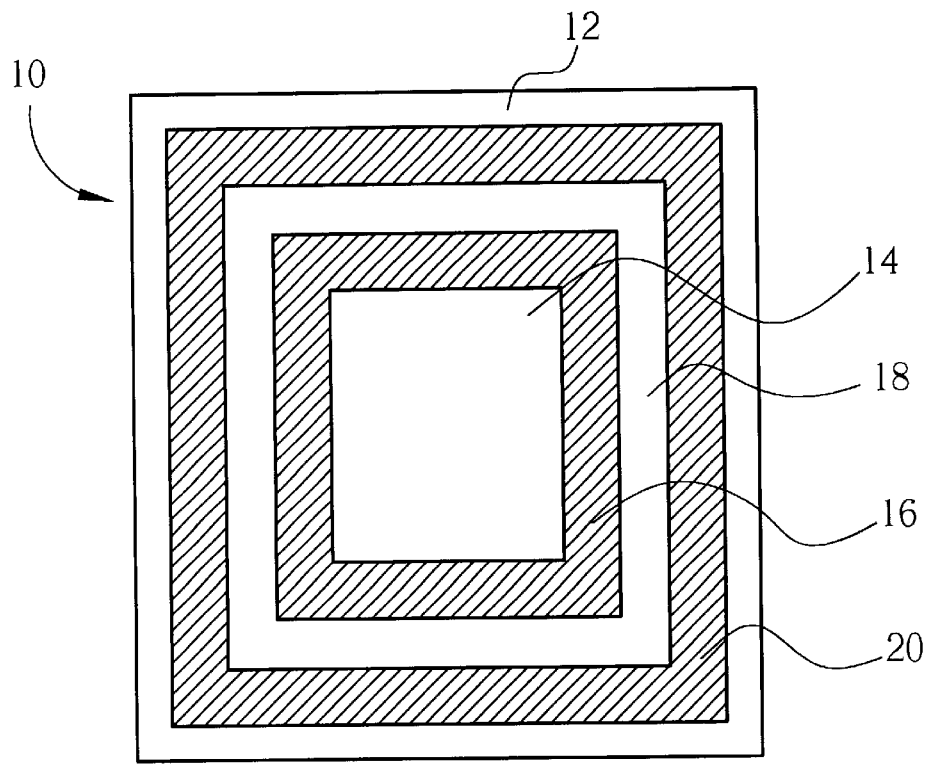
FIG. 1 is a view of the photo mask according to the prior art.
Figure 2:
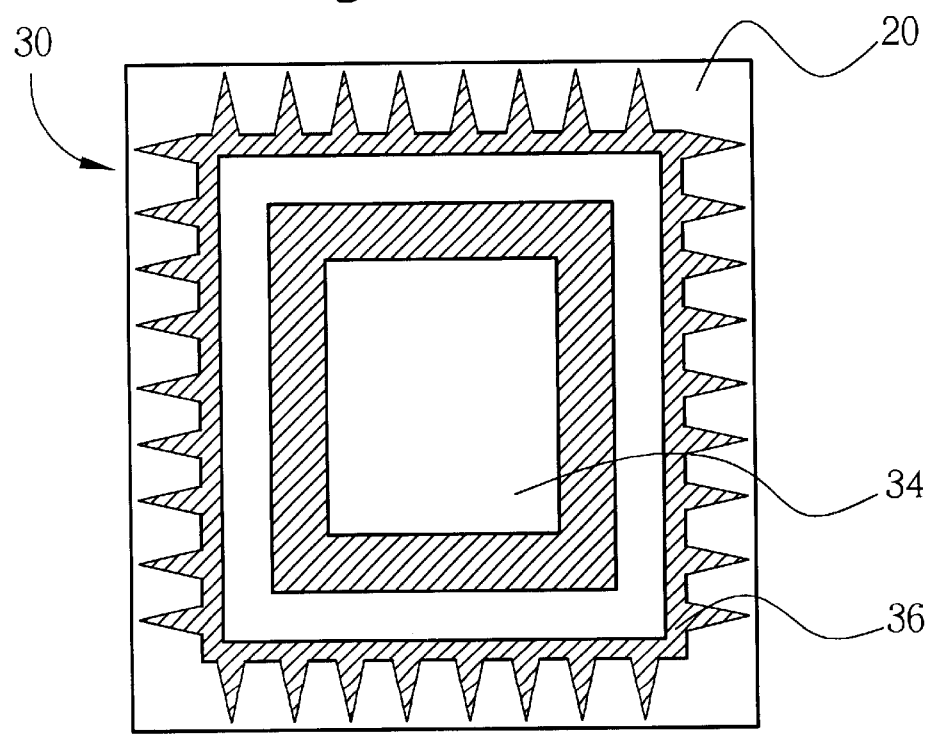
FIG. 2 is a view of the photo mask according to the present invention.

Please refer to FIG. 2, FIG. 2 is a view of the photo mask 30 according to the present invention. The photo mask 30 provides an ESD protective function. The photo mask 30 comprises a transparent substrate comprising quartz or glass, a pattern area 34 comprising a patterned shielding layer with a predetermined pattern formed over the predetermined area on the transparent substrate, and an ESD protective layer 36 on the transparent substrate and around the pattern area 34.

The patterned shielding layer or the pattern area 34 and the ESD protective layer 36 both comprise a chromium film, which is made 1000~1200 Å thick over the surface of the transparent substrate by means of magnetic DC sputtering followed by patterning and etching the predetermined pattern onto the chromium film and removing the unwanted chromium from the transparent substrate. The surfaces of the patterned shielding layer of the pattern area 34 and the ES protective layer 36 might have a $Cr_2O_3$ layer 200 angstroms thick over each chromium layer as an anti-reflective layer to reduce the reflectivity of each chromium layer. Through the same etching process, a plurality of saw-tooth shaped discharging peaks are made around the outer fringe of the ESD protective layer 36, pointing outward.

If the photo mask 30 comes in contact with any user or other objects, static electricity is induced in the pattern area 34 and in the chromium film of the ESD protective layer 36. According to the peak discharge theory, the peak area of the electric field is stronger. Therefore static electricity will concentrate in each peak surrounding the ESD protective layer 36, forming electric fields. Once the static electricity accumulates in the discharging peaks to a certain level, opposite charges are induced in, surrounding air particles, and static charges rush to the end of each peak. At this moment, a neutralizing discharge reaction will occur between the static electricity in the peaks and the inductive charges in the air and cancel out the charges carried in both. In other words, static charges in the photo mask 30 will have neutralizing discharge reaction with the air particles through the peaks of the ESD protective layer 36, removing static electricity from the photo mask 30 into the air.

In a neutralizing discharge reaction, the charges in the peaks and the inductive charges in the air release electrical energy in order to reach a more stablestate. Again, the released electrical energy will raise the temperature of the peaks, but because the function of the peaks is to concentrate the static charges at their tips to perform the ESD protective function, the high heat resulting from the neutralizing discharge reaction in the tip of each peak does not, despite the occurrence of the burn mark, reduce the clarity of the pattern-transferring in the pattern area 34.

Figure 3:
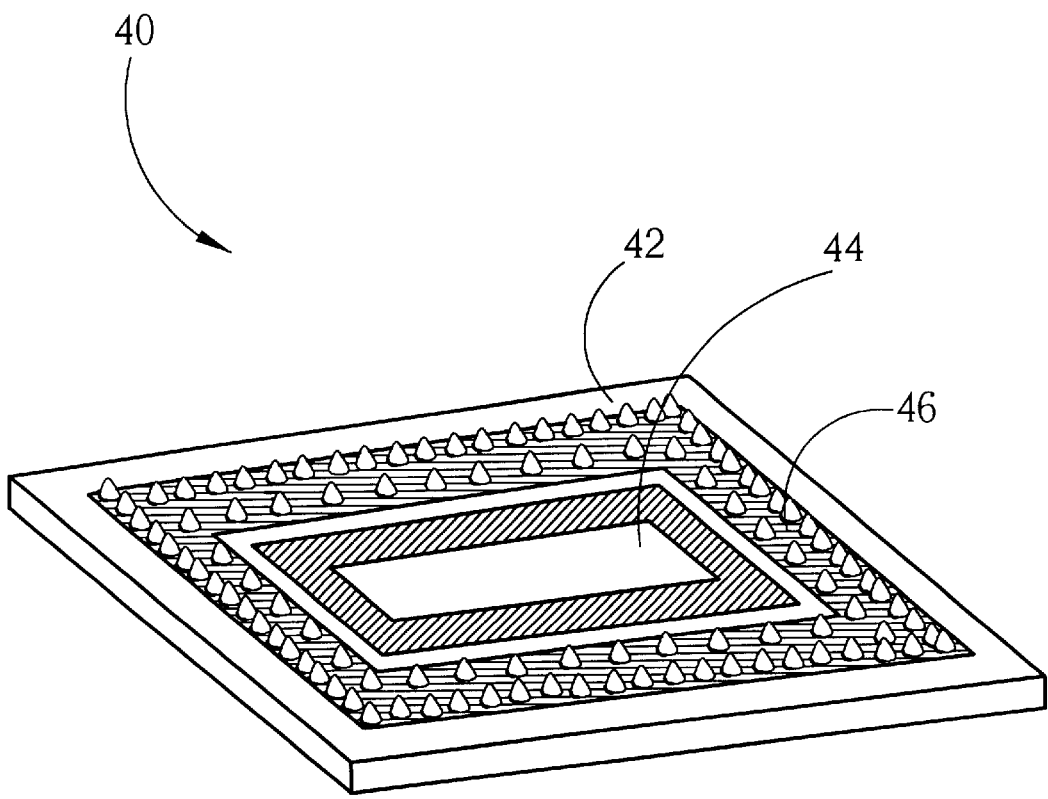
FIG. 3 is a view of an alternative photo mask according to the present invention.

Please refer to FIG. 3, which is a view of an alternative photo mask 40 according to the present invention. The photo mask 40 comprises a transparent substrate 42 comprising quartz or glass, a patterned shielding layer of chromium formed on a predetermined area of the transparent substrate 42 as a pattern area 44, and an ESD protective layer 46 comprising a chromium film on the transparent substrate 42 and around the pattern area 44. The ESD protective layer 46 has a plurality of discharging peaks positioned on the surface of the ESD protective layer 46, pointing outward, used for discharging the static electricity from the ESD protective layer 46 into the air. Moreover, the ESD protective layer 46 is not in contact with the shielding layer of the pattern area 44, and the fringe of the shielding layer of the pattern area 44 on the side of the ESD protective layer 46 does not have discharge peaks.

Just as in the photo mask 30 shown in FIG. 2, as +Q static electric charges are formed in the pattern area 44, the same amount of electric charges are induced in the ESD protective layer 46, resulting in the same amount of inductive charges −Q in the inner side of the ESD protective layer 46. Since the ESD protective layer 46 is electrically neutral as a whole, the outer side of the ESD protective layer 46 would have +Q electric charges as well, and these +Q electric charges would concentrate in the peaks. Once the charges in each peak accumulate to a certain level, the +Q charges in each peak will have a neutralizing discharge reaction with surrounding air particles and will be expelled into the air from the photo mask 40, which is restored to a neutral state.

In this invention, the ESD protective layer has a plurality of outward-pointing peaks in the outer fringe of the photo mask. These peaks concentrate the static charges formed in the photo mask so that electric fields only form in the peaks. This prevents the pattern area from being electrically disturbed. The air particles are drawn to these electric fields in the peaks instead of adhering to the pattern area. Once the static charges accumulate to a certain level resulting in the electric field of a certain strength in the peaks, they have neutralizing discharge reaction with the air particles. Since it is in the tip of each peak that the neutralizing discharge reaction and the subsequent high heat occurs, they do not cause burn marks, damage the circuit pattern in the pattern area, or decrease the clarity of the pattern transfer.

The description above is an optimum sample performance of the present invention. Those skilled in the art will readily observe that numerous modification and alterations of the device may be made while retaining the teachings of the invention Accordingly, the above disclosure should be construed as limited only by the metes and bounds of the appended claims.

What is claimed is:

1. A photo mask with an electric static discharge (ESD) protective function, the mask comprising:

a transparent substrate;

a patterned shielding layer positioned on a predetermined area of the surface of the transparent substrate; and an ESD protective layer positioned on the surface of the transparent substrate, the ESD protective layer surrounding the shielding layer, the ESD protective layer comprising a plurality of discharge peaks, the discharge peaks being used to discharge static electricity into the air so as to remove charge from the photo mask.

2. The mask of claim 1 wherein the transparent substrate is made of quartz or glass.

3. The mask of claim 1 wherein the shielding layer and the ESD protective layer are both made of non-transparent conductive materials.

4. The mask of claim 3 wherein the shielding layer and the ESD protective layer are both made of chromium (Cr) films, and the mask is a hard-surface chromium mask or an antireflective chromium mask.

5. The mask of claim 4 wherein the chromium film is formed using a magnetic direct current (DC) sputtering method, and the chromium film has a thickness of about 1000 angstroms to 1200 angstroms.

6. The mask of claim 4 wherein the chromium film further comprises a chromium oxide ($Cr_2O_3$) film on the surface of the chromium film, the chromium oxide film having a thickness of about 200 angstrom and being used as an antireflective layer.

7. The mask of claim 1 wherein the plurality of discharge peaks surround the outer fringe of the ESD protective layer forming a saw-toothed shaped fringe.

8. The mask of claim 1 wherein the plurality of discharge peaks protrude from the surface of the ESD protective layer.

9. The mask of claim 1 wherein the plurality of discharge peaks discharge into the air using tip field effects.

10. A photo mask with an electric static discharge (ESD) protective function, the mask comprising:
   a transparent substrate;
   a patterned shielding layer positioned on a predetermined area of the surface of the transparent substrate;
   a transparent protective layer positioned on the surface of the transparent substrate, the transparent protective layer covering the shielding layer; and
   an ESD protective layer positioned on the surface of the transparent substrate and surrounding the shielding layer, the ESD protective layer comprising a plurality of discharge peaks positioned on the outer fringe of the ESD protective layer, the discharge peaks being used to discharge static electricity into the air.

11. The mask of claim 10 wherein the transparent substrate is made of quartz or glass.

12. The mask of claim 10 wherein the shielding layer and the ESD protective layer are both made of non-transparent conductive materials.

13. The mask of claim 12 wherein the shielding layer and the ESD protective layer are both made of chromium (Cr) films, and the mask is a hard-surface chromium mask or an antireflective chromium mask.

14. The mask of claim 13 wherein the chromium film is formed using a magnetic direct current (DC) sputtering method, and the chromium film has a thickness of about 1000 angstroms to 1200 angstroms.

15. The mask of claim 13 wherein the chromium film further comprises a chromium oxide ($Cr_2O_3$) film on the surface of the chromium film, the chromium oxide film having a thickness of about 200 angstroms and being used as an antireflective layer.

16. The mask of claim 10 wherein the plurality of discharge peaks surround the outer fringe of the ESD protective layer so as to form a saw-toothed shaped fringe.

17. The mask of claim 10 wherein the ESD protective layer is not in contact with the shielding layer, and no discharge peaks are positioned on the side of the ESD protective layer adjacent to the shielding layer.

18. The mask of claim 10 wherein the plurality of discharge peaks protrude from the surface of the ESD protective layer.

19. The mask of claim 10 wherein the plurality of discharge peaks discharge into the air using tip field effects.

* * * * *